(12) United States Patent
Gui et al.

(10) Patent No.: US 10,061,007 B2
(45) Date of Patent: Aug. 28, 2018

(54) METHOD, APPARATUS, AND ARTICLE FOR FREQUENCY-OVERLAPPED 3-D MULTISPECTRAL MAGNETIC RESONANCE IMAGES

(71) Applicants: Dawei Gui, Waukesha, WI (US); Kevin Matthew Koch, Milwaukee, WI (US)

(72) Inventors: Dawei Gui, Waukesha, WI (US); Kevin Matthew Koch, Milwaukee, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 1098 days.

(21) Appl. No.: 14/317,728

(22) Filed: Jun. 27, 2014

(65) Prior Publication Data
US 2015/0377994 A1    Dec. 31, 2015

(51) Int. Cl.
*G01V 3/00* (2006.01)
*G01R 33/565* (2006.01)
*G01R 33/561* (2006.01)

(52) U.S. Cl.
CPC .... *G01R 33/56536* (2013.01); *G01R 33/5617* (2013.01)

(58) Field of Classification Search
CPC .............................................. G01R 33/56536
USPC ........................................ 324/307, 309, 312
See application file for complete search history.

(56) References Cited

U.S. PATENT DOCUMENTS

| | | | |
|---|---|---|---|
| 4,307,343 A | 12/1981 | Likes | |
| 7,821,264 B2 | 10/2010 | Koch et al. | |
| 7,952,356 B2 | 5/2011 | Koch et al. | |
| 8,274,286 B2 | 9/2012 | Koch et al. | |
| 8,421,459 B2 | 4/2013 | Koch | |
| 2012/0262167 A1* | 10/2012 | Lai ..................... | G01R 33/5611 324/309 |
| 2017/0003370 A1* | 1/2017 | Chen .................... | G06T 7/0012 |
| 2017/0299682 A1* | 10/2017 | Quist ................. | G01R 33/5659 |

OTHER PUBLICATIONS

Koch, et al., Z-Selective Multi-Spectral 3D Imaging: A MAVRIC-SEMAC Hybrid, Proc. Intl. Soc. Mag. Reson. Med. 18 (2010).
Koch, et al., An Automated Spectral Bin Construction Strategy to Enable T1 Contrast in MAVRIC SL, Proc. Intl. Soc. Mag. Reson. Med. (Apr. 2013).

* cited by examiner

*Primary Examiner* — Louis Arana
(74) *Attorney, Agent, or Firm* — Grogan, Tuccillo & Vanderleeden, LLP

(57) ABSTRACT

A method for acquiring 3D multispectral MRI of a target includes scanning a spectrum of spectral windows with an MRI scanner, wherein each spectral window of the spectrum defines a continuously-differentiable distribution of frequencies around a scan frequency and adjacent scan frequencies are spaced apart by substantially uniform frequency offsets such that adjacent spectral windows substantially uniformly overlap, wherein selected adjacent spectral windows are scanned in consecutive passes, and nearest neighbor spectral windows within each pass are scanned at a maximum temporal spacing within the pass.

20 Claims, 5 Drawing Sheets

METHOD, APPARATUS, AND ARTICLE FOR FREQUENCY-OVERLAPPED 3-D MULTISPECTRAL MAGNETIC RESONANCE IMAGES

BACKGROUND

Technical Field

Embodiments of the invention relate generally to methods for magnetic resonance imaging ("MRI"). Particular embodiments relate to methods for enhancement of MRI in inhomogeneous magnetic fields, e.g., for patients having paramagnetic implants such as joint replacements.

Discussion of Art

In MRI imaging, when human or other animal tissue is subjected to a uniform magnetic field, i.e., a polarizing field B0, the individual magnetic moments of particle spins in the tissue attempt to align with the polarizing field, but precess about the field in random order at their characteristic Larmor frequency. If the tissue is subjected to an RF magnetic field, i.e., excitation field B1, which defines an x-y plane and varies at a frequency near a Larmor frequency of selected particles, the net aligned moment, or "longitudinal magnetization" of those selected particles, may be rotated, or "tipped", into the x-y plane to produce a net transverse magnetic moment. After B1 is terminated, the tipped spins "relax" back into the precession defined by B0, and, as a result, produce RF signals. The RF signals may be received and processed to form an image. In order to form a pixelated image for human interpretation, gradient magnetic fields, Gx, Gy, Gz, are applied to localize the tissue response to B1.

Paramagnetic material such as joint implants or bone screws, for example, can create regions of distortion in the polarizing field B0, which detract from accurate localization of the tissue response to excitation. As one solution, 3D multispectral MRI protocols have been demonstrated using proton-density (PD) and short-tau inversion recovery (STIR) contrasts, and have proven effective for removing bulk distortions around metal implants. It has been demonstrated that heavy frequency overlap of spectral components in 3D multispectral MRI can aid in reducing residual image artifacts. Minimum sequence repetition times (TR) of such overlapping 3D multispectral protocols have been limited, due to a need for careful management of spectral window crosstalk within interleaved acquisition sections. Accordingly, 3D multispectral protocols have not been used with TR sufficiently short to generate T1 contrast images. As will be appreciated, T1 contrast is clinically relevant in the assessment of soft tissue and bone enhancement surrounding orthopaedic equipment such as implants and the like.

BRIEF DESCRIPTION

In view of the above, it is desirable to provide 3-D multispectral MRI in which scan intervals are automatically scheduled to allow for flexible repetition times and therefore enhance T1 contrast without detracting from image clarity.

Aspects of the invention provide a method for acquiring 3D multispectral MRI of a target. The inventive method includes scanning a spectrum of spectral windows with an MRI scanner, wherein each spectral window of the spectrum defines a continuously-differentiable distribution of frequencies around a scan frequency and adjacent scan frequencies are spaced apart by substantially uniform frequency offsets such that adjacent spectral windows substantially uniformly overlap, wherein selected adjacent spectral windows are scanned in consecutive passes, and nearest neighbor spectral windows within each pass are scanned at a maximum temporal spacing within the pass.

In embodiments, an apparatus is configured to perform 3-D multispectral MRI. The apparatus includes a magnet assembly, and an MRI controller that is configured to operate the magnet assembly for scanning a spectrum of spectral windows, wherein each spectral window defines a continuously-differentiable distribution of frequencies around a scan frequency and adjacent scan frequencies are spaced apart such that adjacent spectral windows substantially uniformly overlap, wherein selected adjacent spectral windows are scanned in consecutive passes, and nearest neighbor spectral windows within each pass are scanned at a maximum temporal spacing within the pass.

In other embodiments, an article of computer readable media is encoded with a magnetic resonance image by a process that includes scanning a spectrum of spectral windows with an MRI scanner, wherein each spectral window defines a continuously-differentiable distribution of frequencies around a scan frequency and adjacent scan frequencies are spaced apart such that adjacent spectral windows substantially uniformly overlap, wherein selected adjacent spectral windows are scanned in consecutive passes, and nearest neighbor spectral windows within each pass are scanned at a maximum temporal spacing within the pass.

As used herein, the terms "substantially," "generally," and "about" indicate conditions within reasonably achievable manufacturing and assembly tolerances, relative to ideal desired conditions suitable for achieving the functional purpose of a component or assembly.

DRAWINGS

The present invention will be better understood from reading the following description of non-limiting embodiments, with reference to the attached drawings, wherein below:

DETAILED DESCRIPTION

Figure 1:
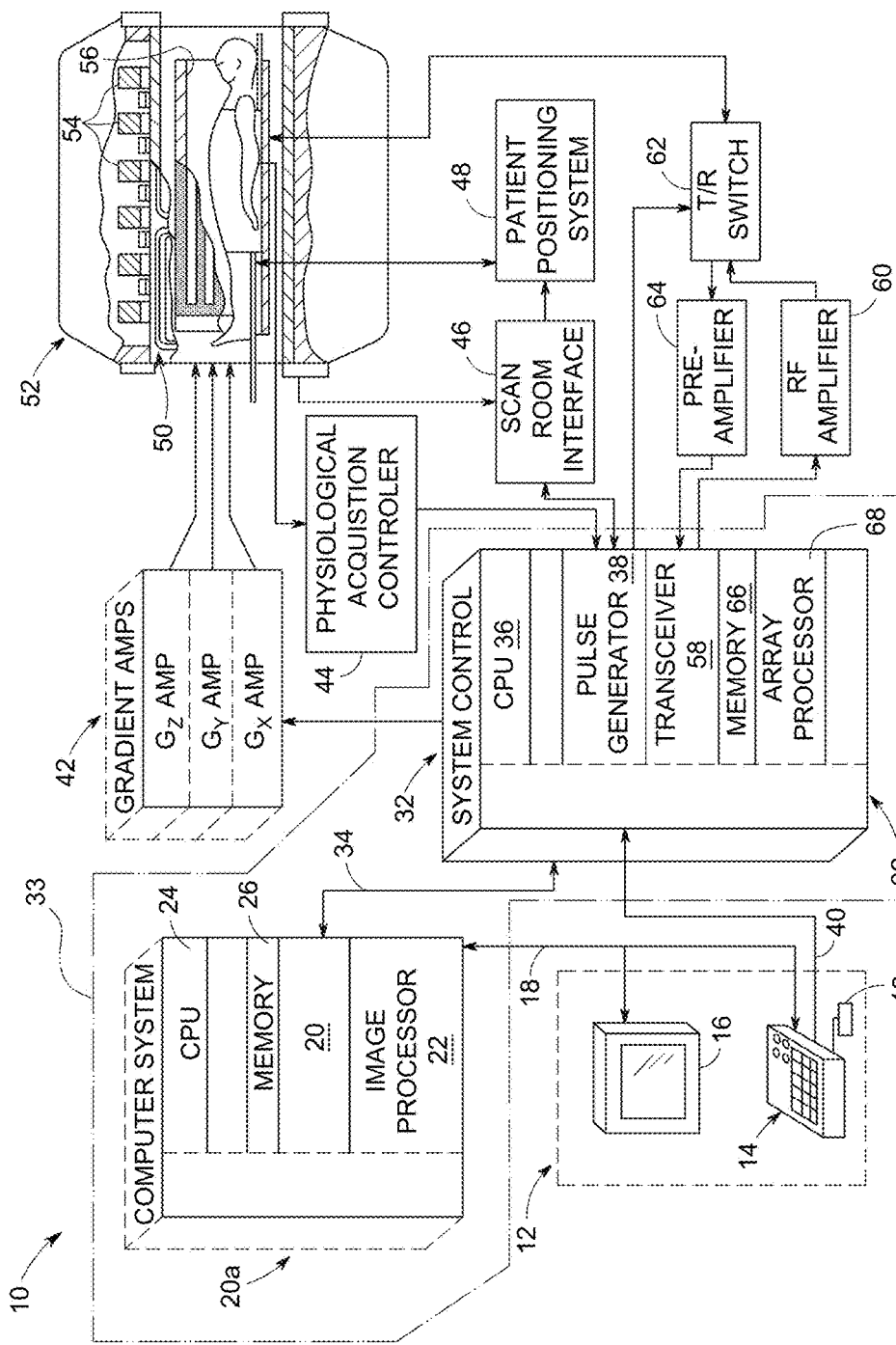
FIG. 1 shows a magnetic resonance imaging system according to an embodiment of the invention.

Reference will be made below in detail to exemplary embodiments of the invention, examples of which are illustrated in the accompanying drawings. Wherever possible, the same reference characters used throughout the drawings refer to the same or like parts, without duplicative description. Exemplary embodiments of the present invention are described with respect to 3D multispectral magnetic resonance imaging (3D MS MRI).

FIG. 1 depicts major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high-speed signal link 34. The computer system 20 and the system control 32 collectively form an "MRI controller" 33. According to embodiments and aspects of the invention, the MRI controller 33 is configured to accomplish 3-D multispectral MRI with enhanced T1 contrast, according to algorithms further discussed below.

The system control 32 includes a set of modules connected together by a backplane 32a. These include a CPU module 36 as well as a pulse generator module 38, which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to several components that are operated by the MRI controller 33, including a set of gradient amplifiers 42, a physiological acquisition controller 44, and a scan room interface circuit 46.

In addition to the above, the pulse generator module 38 operates the gradient amplifiers 42 to achieve desired timing and shape of the gradient pulses that are produced during the scan. The module 38 also receives patient data from the physiological acquisition controller 44, which, in turn, receives signals from a number of different sensors connected to the patient, such as ECG signals from electrodes. The pulse generator module 38 receives signals from various sensors associated with the condition of the patient and the magnet system via the scan room interface circuit 46. The MRI controller 33 utilizes the scan room interface circuit 46 to command a patient positioning system 48 to move the patient or client C to a desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 and a whole-body RF coil 56. In an embodiment of the invention, RF coil 56 is a multi-channel coil. A transceiver module 58 in the system control 32 produces pulses that are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit mode or receive mode.

The MR signals picked up by the multi-channel RF coil 56 are digitized by the transceiver module 58 and are transferred to a memory module 66, or other computer readable media, via the system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long-term storage or it may be further processed by the image processor 22 and conveyed to the operator console 12 and presented on the display 16.

Figure 2:
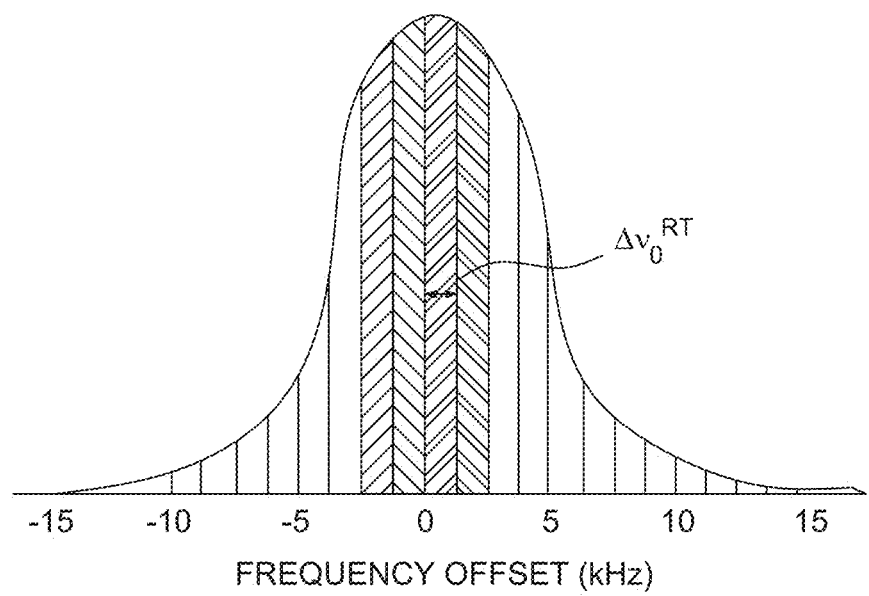
FIG. 2 shows frequency offsets resultant from MRI of a target with a paramagnetic inclusion.

When scanning a target (client C) who has a paramagnetic inclusion, e.g., a bone screw or joint replacement, the implant distorts the gradient waveforms Gx, Gy, Gz in such a way that the frequency response at any given point within the target may be offset from an expected "zero" frequency, as shown in FIG. 2. For example depending on proximity to an implant, a particular location within the target may respond anywhere between about 15 kHz below or above the expected frequency response. Because localization of image pixels depends on correlating frequency responses, the frequency offsets caused by paramagnetic device inclusion result in distorted images with pixels displaced from where they should be shown. 3-D multispectral MRI is known to resolve issues with frequency offsets, by superimposing images obtained contemporaneously from plural frequencies—a spectrum of spectral windows.

Figure 3:
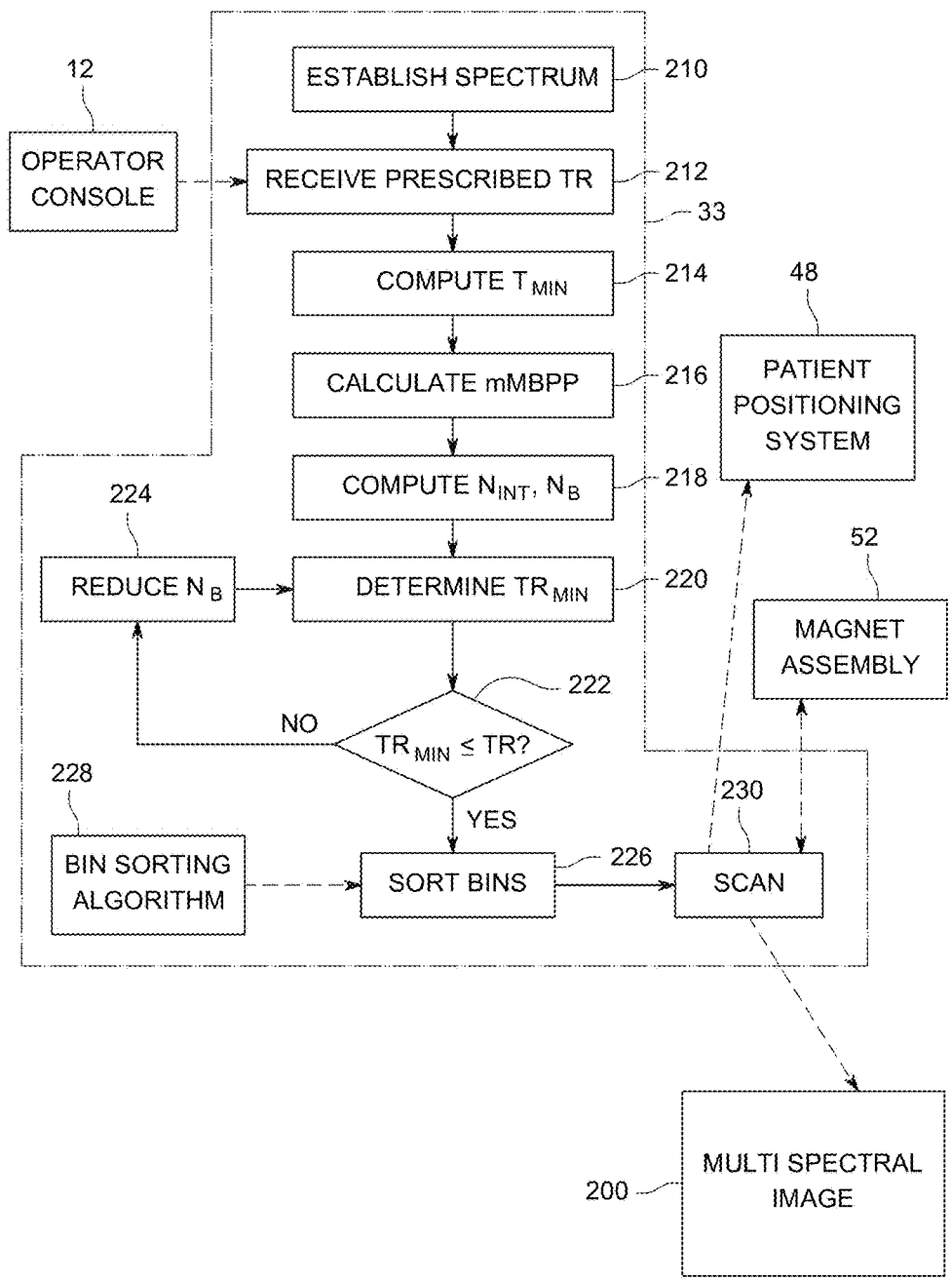
FIG. 3 shows a process for enhancing T1 contrast of multispectral 3-D Multispectral MRI according to an embodiment of the invention.

Accordingly, in an exemplary aspect of the invention, as shown in FIG. 3, the MRI controller 33 is configured to acquire a multispectral image 200 by scanning a target or client C in a plurality of passes or intervals p, each interval having a duration TR and capturing data from some of a plurality $N_T$ of spectral windows 300 (also known as "frequency bins") that fill a spectrum 302 (shown in FIG. 4) and that each have a respective echo-train-length $t_{min}$. For all cases, adjacent bins $300_n$, $300_{n+1}$ are assigned to different intervals p, while within each interval p the nearest neighbor bins $300_n$, $300_{n+2}$, $300_{n-1}$ are maximally separated from one another (furthest temporal order), according to a bin sorting algorithm 226.

Figure 4:
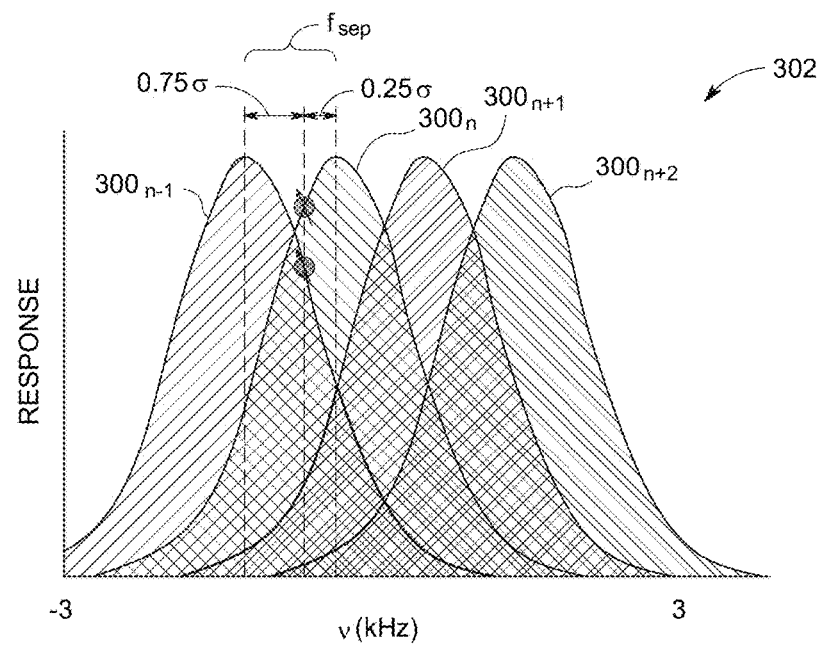
FIG. 4 shows a spectrum of spectral windows according to an embodiment of the present invention.

Referring to FIGS. 3 and 4, at a step 210, the MRI controller 33 establishes the spectrum 302 of spectral windows 300. Each spectral window 300 defines a corresponding continuously-differentiable distribution 304 of frequencies, and adjacent spectral windows are spaced apart by substantially uniform frequency offsets $f_{sep}$, such that adjacent spectral windows substantially and uniformly overlap. In particular, the adjacent spectral windows may overlap at about 0.25σ, at about 0.75σ, or at any intermediate level of their respective distributions (where "a" defines a bandwidth within one standard deviation from the scan frequency). For example, adjacent spectral windows may overlap at about 0.4σ, at about 0.6σ, or at about 0.5σ as shown generally in FIG. 4. Due to superimposition of spectral windows to produce the final image 200, as further discussed below, spacing the spectral windows at values of $f_{sep}$ that produce overlaps less than or greater than about 0.5σ will tend to produce ripple artifacts of increasing strength, either hypo intense (detracting from contrast) or hyper intense (exaggerating contrast). The overlap distance will be generally about one half of $f_{sep}$. Therefore, in certain embodiments, $f_{sep}$ will be chosen approximately equal to σ.

At a step 212, the MRI controller 33 receives from the operator console 12 a user-selectable value TR that prescribes the interval duration desired in order to obtain useful T1/T2 contrasts. At subsequent steps, the MRI controller 33 then establishes a sequence for scanning the spectrum of spectral windows in a plurality of scan intervals p.

In order to appropriately schedule the scan intervals p, at step 214 the MRI controller 33 implements PSD calculations, familiar to the skilled worker, utilizing systemic hardware and specific-absorption-rate (SAR) limits, to compute for each spectral window 300 a minimum echo train listening time $t_{min}$.

At step 216 the MRI controller 33 calculates a local variable $$mMBPP=\min(N_T/2, TR/t_{min}).$$

Then at step 218, the MRI controller 33 computes a preliminary number $N_{int}$ of scan intervals p, based on divisors of $N_T$, e.g., for $N_T=24$, $N_{int}=f(mMBPP)$:
  mMBPP<6, 6;
  6≤mMBPP<8, 4;
  8≤mMBPP<12, 3;
  12≤mMBPP, 2 and also computes a number $N_b$ of bins to be included in each pass p, such that $N_b$ is the largest number that evenly divides the total number of spectral windows $N_T$ among $N_{int}$ passes or intervals.

The MRI controller 33 then at step 220 determines across all intervals p a minimum interval duration $TR_{min}$ in light of all system parameters, i.e.

$$TR_{min}=\max(p=1\ldots N_{int})\Sigma_p(1,N_b)t_{min(i)}.$$

At step 222 the MRI controller 33 compares TR to the PSD calculated $TR_{min}$. In case $TR_{min}>TR$, then at step 224 the MRI controller 33 modifies the bin construction to reduce $N_b$, i.e. increase $N_{int}$ for more intervals with fewer bins per interval so as to reduce $TR_{min}$. Steps 220-224 can iterate up to $N_{int(max)}=GCD(N_T)$, e.g., as many as eight intervals for an exemplary embodiment with $N_T=24$.

Figure 5:
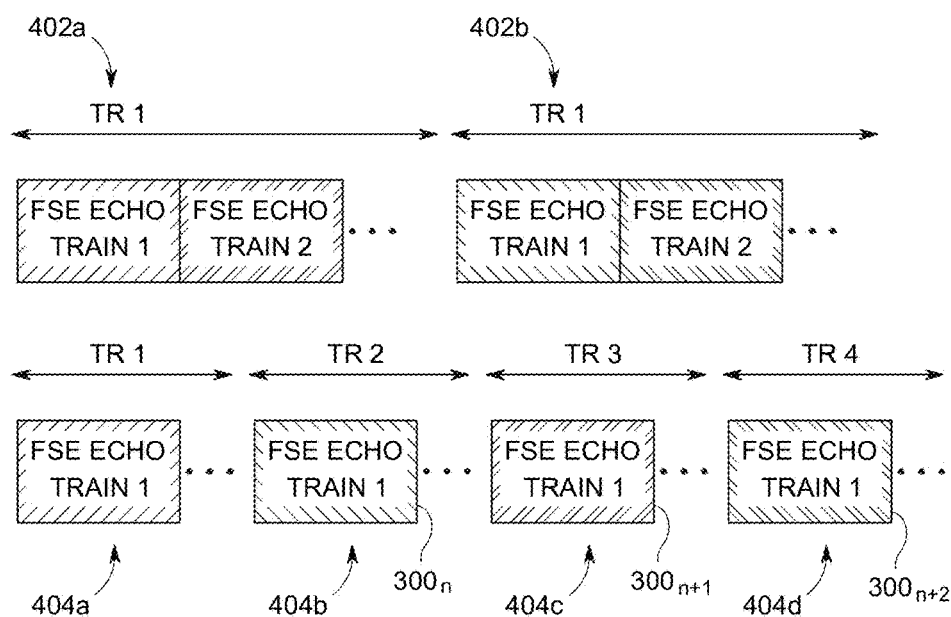
FIG. 5 shows first and second sequences of scan intervals, according to another embodiment of the present invention.
Figure 6:
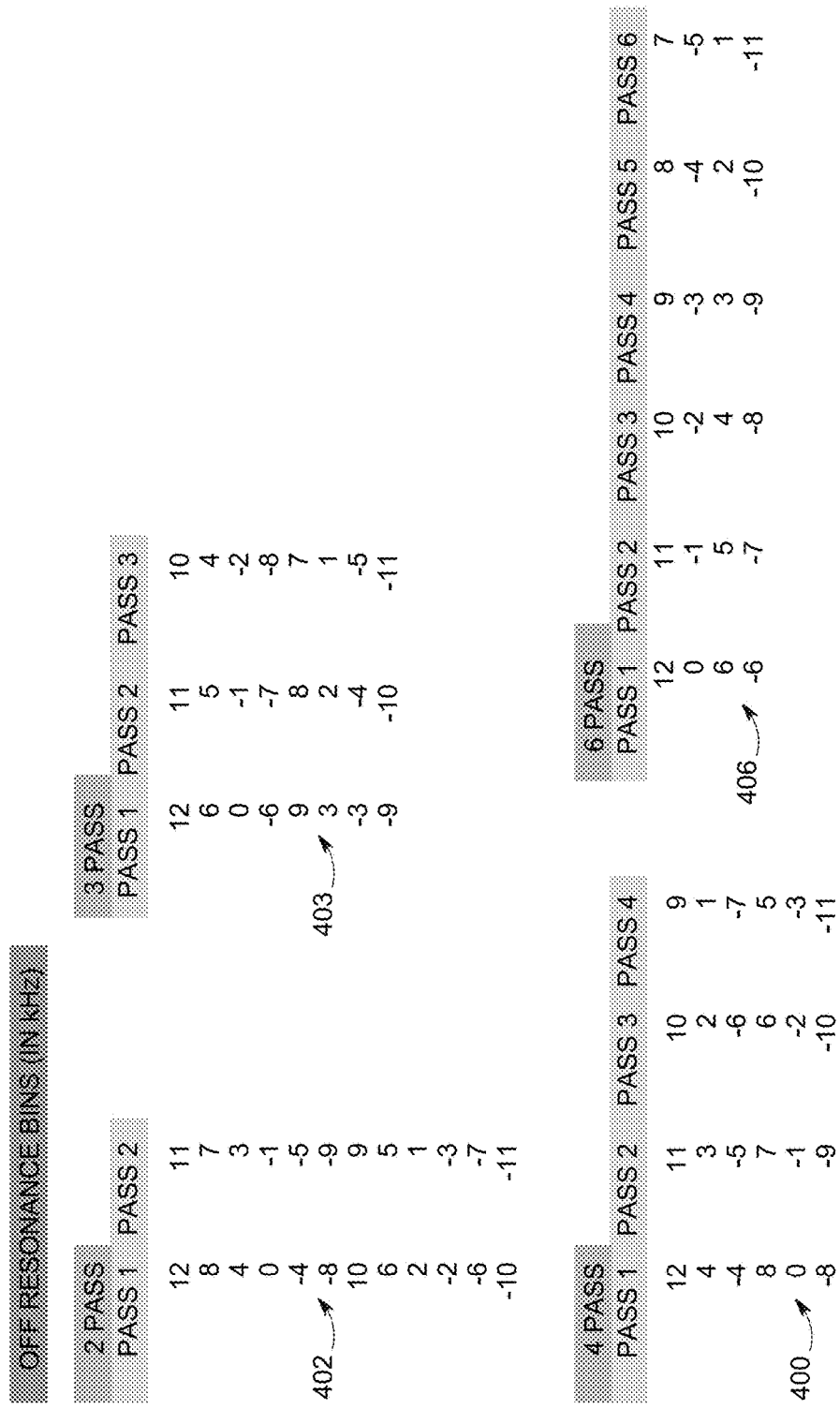
FIG. 6 shows a plurality of sequences of scan intervals, according to another embodiment of the present invention.

Bin sorting algorithms, according to embodiments of the invention, schedule adjacent scan frequencies to be consecutively scanned at time intervals according to their respective repetition times TR, and schedule non-adjacent scan frequencies to be scanned according to their respective acquisition times $t_{min}$, so that the "nearest neighbor" scan frequencies within each interval are scanned at a maximum temporal spacing within the interval. Generally, an aspect of the invention is that frequency-adjacent bins are scanned at TR periodicity in order to build-up T1 signal by aliasing, but within TR intervals, frequency overlap is avoided or minimized among time-adjacent bins. For example, as shown in FIG. 5, spectral windows 300n−1, 300n, 300n+1, and 300n+2 may be separated into separate intervals 404a, 404b, 404c, 404d that provide for relatively short TR acquisitions (used to enhance T1 contrast by aliasing the adjacent spectral windows). On the other hand, spectral windows may be sorted so that nearest-neighbor spectral windows 300n−1, 300n+1 (or 300n, 300n+2) are at maximum temporal spacing within a same interval.

The above algorithm 228 also can be described via a recursion, which provides a deterministic bin arrangement mechanism for frequency offsets of passes or intervals indexed from p=1:$N_{int}$, and spectral windows indexed from b=1:$N_b$ in each interval. The initial bin offsets in each pass (p) are given by $$\Delta f(1,p)=\partial f_{max}-\partial f_{sep}(i-1),$$

where $\partial f_{max}$ is a maximum frequency offset within the acquisition spectrum, $\partial f_{sep}$ is a frequency offset between adjacent spectral windows, and i is the sequence index of the pass p. For example, for bins in a range b=2:Nb, frequency offsets then are computed according to $$\Delta f(b,p)=\Delta f(b-1,p)-2*\partial f_{sep}N_{int}.$$

This recursion relation must also enforce periodic boundary conditions, which can be expressed through the condition:

$$\text{if }[\Delta f(b,p)<(\partial f_{max}-\partial f_{sep}N_T)]\text{ then }[f(b,p)=f(1,p)-N_{int}].$$

It should be noted that the exemplary bin-sorting algorithm inherently restricts frequency of bin set aliasing to only a single alias per interval. For longer TR periods needed for PD and STIR contrasts, the additional time for longitudinal relaxation recovery accommodates overlap between n+2 bins that have maximum temporal separation from one another within a single interval, mitigating crosstalk artifacts that would otherwise emerge. This approximation allows for shorter ETL values to be used for PD and STIR contrasts, which moderates blurring from short T2 tissues.

To minimize residual spatial distortion artifacts, it is helpful to select spectral windows that have continuously-differentiable frequency distributions (in some embodiments, Gaussian distributions) and that overlap substantially uniformly, for example, by between about 0.25σ and about 0.75σ, as shown in FIG. 3. In certain embodiments, it is helpful to select spectral windows that overlap by between about 0.4σ and about 0.6σ. In select embodiments, spectral windows are selected to overlap by about 0.5σ.

For longer TR periods, which utilize more spectral windows in each interval, only n and n+1 bins are separated into separate intervals. For shorter TR periods needed for enhanced T1 contrast, the n, n+1, and n+2 spectral windows all should be acquired in separate intervals (i.e. $N_{int}\geq 3$). This constraint can easily be implemented by setting the minimum ETL for the sequence to be roughly 8. When short TR periods are prescribed under such a constraint, the presented algorithm automatically sorts the bins into a least 3 intervals.

In summary, the presented algorithm allows for a prospective automated determination of optimal interleaved bin arrangements that minimize crosstalk between overlapping bins for any prescribed TR period. In particular, this feature enables flexibility of TR prescription, which adds T1 contrast capabilities to implementations of heavily overlapping and interleaved 3D MS MRI.

Having established an appropriate sequence of intervals, at step 230 the MRI controller 33 operates the patient positioning system 48 and the magnet assembly 52 in order to perform MRI of the target, according to the established sequence. The MRI controller 33 then additively superimposes the plurality of image data arrays generated from the plurality of spectral windows, thereby generating the 3-D multispectral magnetic resonance image 200 having enhanced T1 contrast relative to conventional modes of frequency-overlapped 3-D multispectral MRI.

In certain embodiments, the invention provides a method for acquiring 3D multispectral MRI of a target. The inventive method includes scanning a spectrum of spectral windows with an MRI scanner, wherein each spectral window of the spectrum defines a continuously-differentiable distribution of frequencies around a scan frequency and adjacent scan frequencies are spaced apart by substantially uniform frequency offsets such that adjacent spectral windows substantially uniformly overlap, wherein selected adjacent spectral windows are scanned in consecutive passes, and nearest neighbor spectral windows within each pass are scanned at a maximum temporal spacing within the pass. For example, adjacent spectral windows may overlap by between about $0.25\sigma$ and about $0.75\sigma$; by between about $0.4\sigma$ and about $0.6\sigma$; or by about $0.5\sigma$. Adjacent scan frequencies may be spaced apart by about $1\sigma$ of their respective spectral windows. The method may also include superimposing images produced by scanning a plurality of the spectrum of spectral windows. For example, each spectral window of each pass may have a scan frequency adjacent to the scan frequency of the corresponding spectral window within the next pass, and within each pass, consecutive spectral windows may have maximally separated scan frequencies. The number of passes may be chosen as a divisor of the total number of spectral windows, according to a minimum echo time required for scanning each spectral window. Particular embodiments may further include configuring a controller of the MRI scanner to scan the spectral windows in a sequence of passes according to $$\Delta f(b=1,p)=\partial f\text{max}-\partial f\text{sep}(i-1),$$

and $$\Delta f(b=2:Nb,p)=\Delta f(b-1,p)-2*\partial f\text{sep}N\text{int}$$

for frequency offsets of passes indexed from p=1:Nint, and spectral windows indexed from b=1:Nb in each pass, where $\partial f\text{max}$ is a maximum frequency offset within the acquisition spectrum, $\partial f\text{sep}$ is a frequency offset between adjacent scan frequencies, and i is the sequence index of the pass p.

Other embodiments of the invention provide an apparatus configured to perform 3-D multispectral MRI. The apparatus includes a magnet assembly, and an MRI controller that is configured to operate the magnet assembly for scanning a spectrum of spectral windows, wherein each spectral window defines a continuously-differentiable distribution of frequencies around a scan frequency and adjacent scan frequencies are spaced apart such that adjacent spectral windows substantially uniformly overlap, wherein selected adjacent spectral windows are scanned in consecutive passes, and nearest neighbor spectral windows within each pass are scanned at a maximum temporal spacing within the pass. For example, adjacent spectral windows may overlap by between about $0.25\sigma$ and about $0.75\sigma$; by between about $0.4\sigma$ and about $0.6\sigma$; or by about $0.5\sigma$. Adjacent scan frequencies may be spaced apart by about $1\sigma$ of their respective spectral windows. The MRI controller may also be configured to superimpose images produced by scanning a plurality of the spectrum of spectral windows.

In other embodiments, an article of computer readable media is encoded with a magnetic resonance image by a process that includes scanning a spectrum of spectral windows with an MRI scanner, wherein each spectral window defines a continuously-differentiable distribution of frequencies around a scan frequency and adjacent scan frequencies are spaced apart such that adjacent spectral windows substantially uniformly overlap, wherein selected adjacent spectral windows are scanned in consecutive passes, and nearest neighbor spectral windows within each pass are scanned at a maximum temporal spacing within the pass. The process may also include superimposing images produced by scanning a plurality of the spectrum of spectral windows. For example, the spectral windows may be scanned in a sequence of passes according to $$\Delta f(b=1,p)=\partial f\text{max}-\partial f\text{sep}(i-1),$$

and $$\Delta f(b=2:Nb,p)=\Delta f(b-1,p)-2*\partial f\text{sep}N\text{int}$$

for frequency offsets of passes indexed from p=1:Nint, and spectral windows indexed from b=1:Nb in each pass, where $\partial f\text{max}$ is a maximum frequency offset within the acquisition spectrum, $\partial f\text{sep}$ is a frequency offset between adjacent spectral windows, and i is the sequence index of the pass p. $N_{int}$ may be chosen as a divisor of the total number of spectral windows, according to minimum echo time $t_{min}$ required for scanning each spectral window. In certain embodiments, each spectral window of each pass may have a scan frequency adjacent to the scan frequency of the corresponding spectral window within the next pass, and within each pass, consecutive spectral windows may have maximally separated scan frequencies.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described method, apparatus, or article, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method for acquiring 3D multispectral MRI of a target, comprising:
    scanning a spectrum of spectral windows with an MRI scanner, wherein
    each spectral window of the spectrum defines a continuously-differentiable distribution of frequencies around a scan frequency and adjacent scan frequencies are spaced apart by substantially uniform frequency offsets such that adjacent spectral windows substantially uniformly overlap,
    wherein selected adjacent spectral windows are scanned in consecutive passes, and nearest neighbor spectral windows within each pass are scanned at a maximum temporal spacing within the pass.

2. The method as claimed in claim 1, wherein adjacent spectral windows overlap by between about 0.25 standard deviation and about 0.75 standard deviation.

3. The method as claimed in claim 1, wherein adjacent spectral windows overlap by between about 0.4 standard deviation and about 0.6 standard deviation.

4. The method as claimed in claim 1, wherein adjacent spectral windows overlap by about 0.5 standard deviation.

5. The method as claimed in claim 1, wherein adjacent scan frequencies are spaced apart by about 1 standard deviation of their respective spectral windows.

6. The method as claimed in claim 1, further comprising: superimposing images produced by scanning a plurality of the spectrum of spectral windows.

7. The method as claimed in claim 1, wherein each spectral window of each pass has a scan frequency adjacent to the scan frequency of the corresponding spectral window within the next pass, and within each pass, consecutive spectral windows have maximally separated scan frequencies.

8. The method as claimed in claim 7, wherein the number of passes is chosen as a divisor of the total number of scan frequencies, according to a minimum echo time required for scanning each spectral window.

9. The method as claimed in claim 1, wherein a controller of the MRI scanner is configured to scan the spectral windows in a sequence of passes according to $$\Delta f(b=1,p) \partial f_{max} - \partial f_{sep}(i-1),$$

and $$\Delta f(b=2:Nb,p) = \Delta f(b-1,p) - 2*\partial f_{sep}N_{int}$$

for frequency offsets of passes indexed from $p=1:_{int}$, and spectral windows indexed from $b=1:N_b$ in each pass, where $\partial f_{max}$ is a maximum frequency offset within the acquisition spectrum, $\partial f_{sep}$ is a frequency offset between adjacent scan frequencies, and i is the sequence index of the pass p.

10. An apparatus configured to perform 3-D multispectral MRI, comprising:
    a magnet assembly; and
    an MRI controller that is configured to operate the magnet assembly for scanning a spectrum of spectral windows, wherein
    each spectral window defines a continuously-differentiable distribution of frequencies around a scan frequency and adjacent scan frequencies are spaced apart such that adjacent spectral windows substantially uniformly overlap,
    wherein selected adjacent spectral windows are scanned in consecutive passes, and nearest neighbor spectral windows within each pass are scanned at a maximum temporal spacing within the pass.

11. The apparatus as claimed in claim 10, wherein adjacent spectral windows overlap by between about 0.25 standard deviation and about 0.75 standard deviation.

12. The apparatus as claimed in claim 10, wherein adjacent spectral windows overlap by between about 0.4 standard deviation and about 0.6 standard deviation.

13. The apparatus as claimed in claim 10, wherein adjacent spectral windows overlap by about 0.5 standard deviation.

14. The apparatus as claimed in claim 10, wherein adjacent scan frequencies are spaced apart by about 1 standard deviation of their respective spectral windows.

15. The apparatus as claimed in claim 10, wherein the MRI controller is further configured to superimpose images produced by a plurality of the spectrum of spectral windows.

16. An article of computer readable media encoded with a magnetic resonance image by a process comprising:
    scanning a spectrum of spectral windows with an MRI scanner, wherein
    each spectral window defines a continuously-differentiable distribution of frequencies around a scan frequency and adjacent scan frequencies are spaced apart such that adjacent spectral windows substantially uniformly overlap,
    wherein selected adjacent spectral windows are scanned in consecutive passes, and nearest neighbor spectral windows within each pass are scanned at a maximum temporal spacing within the pass.

17. The article as claimed in claim 16, wherein the process further includes superimposing images produced by a plurality of the spectrum of spectral windows.

18. The article as claimed in claim 16, wherein spectral windows are scanned in a sequence of passes according to $$\Delta f(b=1,p) \partial f_{max} - \partial f_{sep}(i-1),$$

and $$\Delta f(b=2:Nb,p) = \Delta f(b-1,p) - 2*\partial f_{sep}N_{int}$$

for frequency offsets of passes indexed from p=1: $N_{int}$, and spectral windows indexed from b=1:$N_b$ in each pass, where $\partial f_{max}$ is a maximum frequency offset within the acquisition spectrum, a $\partial f_{sep}$ is a frequency offset between adjacent spectral windows, and i is the sequence index of the pass p.

19. The article as claimed in claim 18, wherein $N_{int}$ is chosen as a divisor of the total number of spectral windows, according to minimum echo time $t_{min}$ required for scanning each spectral window.

20. The article as claimed in claim 16, wherein each spectral window of each pass has a scan frequency adjacent to the scan frequency of the corresponding spectral window within the next pass, and within each pass, consecutive spectral windows have maximally separated scan frequencies.

* * * * *